United States Patent [19]

Masters

[11] Patent Number: 4,591,657
[45] Date of Patent: May 27, 1986

[54] TAMPER-PROOF EQUIPMENT SECURING HOUSING

[76] Inventor: Larry C. Masters, Rte. 1, Gap Creek Rd., Marietta, S.C. 29661

[21] Appl. No.: 510,672

[22] Filed: Jul. 5, 1983

[51] Int. Cl.$^4$ .............................................. H05K 5/00
[52] U.S. Cl. ........................................ 174/50; 220/210
[58] Field of Search .................. 174/50, 52 R, 59, 60;
339/36, 37, 39; 70/63; 220/210

[56] References Cited

U.S. PATENT DOCUMENTS 2,662,109 12/1953 Tapp et al. ........................ 174/52 R
4,339,629 7/1982 Stanmore .............................. 174/50

FOREIGN PATENT DOCUMENTS 869238 3/1953 Fed. Rep. of Germany ........ 174/59

Primary Examiner—Arthur T. Grimley
Assistant Examiner—D. A. Tone
Attorney, Agent, or Firm—Dority & Manning

[57] ABSTRACT

A housing for securing equipment such as TV cable connection equipment in a substantial tamper-proof manner. The housing includes a bottom member having a base with sides extending upwardly therefrom. A cover corresponding in size with the bottom extends over the bottom with side walls extending downwardly from a top thereof. An open top recessed housing is carried by the top of said cover and extends downwardly into the housing. A lock is carried within the open top recessed housing for being secured on top of a locking rod in order to secure the cover onto the bottom member. The lower end of the locking rod is welded to the base of the bottom member.

2 Claims, 3 Drawing Figures

TAMPER-PROOF EQUIPMENT SECURING HOUSING

BACKGROUND OF THE INVENTION

Heretofore cable television has required that various equipment be maintained at the location of the customer so that the cable TV companies can selectively connect various cables or channels to the respective houses in an area. Normally, there will be a single junction box supplying several houses and when pay TV is involved, all of the houses will not be subscribing to the same stations. In order to selectively supply the channels to the particular houses, it is necessary that connecting equipment be maintained near the location of the house. One problem of locating this equipment adjacent the homes of the subscribers is that often the subscribers will tamper with the equipment in an attempt to tie in with cables for which they are not paying.

In the past in order to minimize the problem, the equipment has been placed in steel boxes which are centrally located. These boxes have been secured by lock and key that are normally positioned externally of the box. While this does prevent a certain amount of tampering, often people will destroy the locks with sledge hammers and the like in order to obtain access to the equipment.

Not only does such give the recipients free access to the various TV channels, it also causes substantial damage to the cable TV company's property.

In the past, other industries have had similar problems and have attempted to produce housings with locks wherein a guard extends around the lock for minimizing or preventing tampering therewith. Examples of such devices are disclosed in U.S. Pat. Nos. 592,300, 3,617,610, and 3,752,900.

SUMMARY OF THE INVENTION

This invention relates to a housing for securing equipment such as TV cable connecting equipment in a substantially tamper-proof manner. The housing is normally constructed of steel and includes a bottom member having a base with sides extending upwardly therefrom. A cover corresponding in size and shape to the bottom extends over the bottom portion and includes a planar top with side walls depending downwardly therefrom. The side walls of the cover overlap the upwardly extending sides of the bottom member.

An opened top recess housing extends downwardly from the top into the interior of the housing with the opened top being flush with the top of the cover.

In order to secure the cover onto the bottom member, a locking rod which has its lower end welded to the base of the bottom, extends upwardly and projects through a hole in the bottom of the opened top recess housing and terminates therein. A lock, which has a hole in the bottom therein, is inserted within the opened top recess housing over the upper end of the locking rod for being locked thereon. When the lock is positioned within the recess over the upper end of the locking rod, such secures the cover on top of the bottom member while maintaining the entire lock below the top of the cover. As a result, the only portion of the lock that is exposed is the key receiving face of the lock. This prevents anyone from swinging a hammer or a sledge hammer and knocking the lock off of the housing.

Accordingly, it is an important object of the present invention to provide a substantially tamper-proof housing for securing electrical equipment such as cable TV switching equipment.

Another important object of the present invention is to provide a simple, strong and relatively inexpensive housing for securing equipment.

The construction designed to carry out the invention will be hereinafter described, together with other features thereof.

The invention will be more readily understood from a reading of the following specification and by reference to the accompanying drawing forming a part thereof, wherein an example of the invention is shown and wherein:

DESCRIPTION OF A PREFERRED EMBODIMENT

Figure 1:
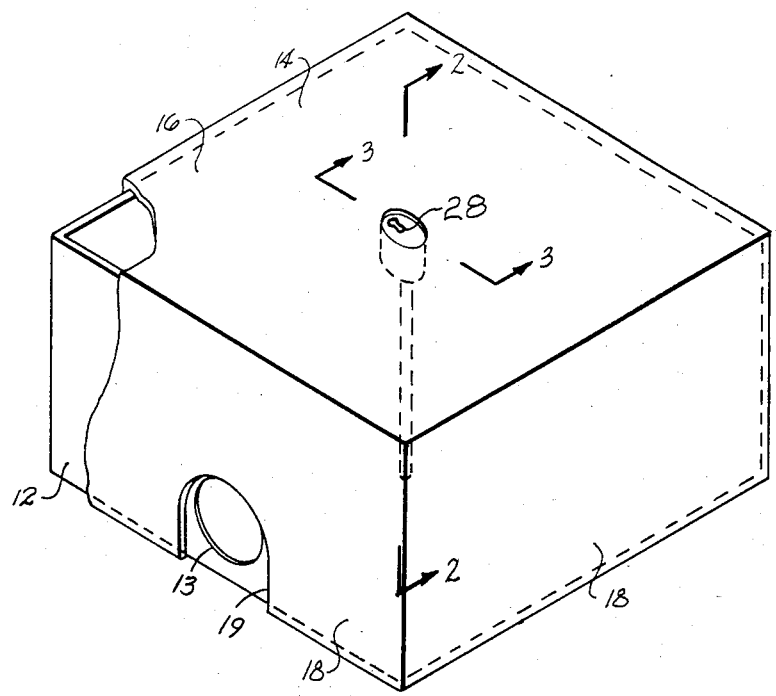
FIG. 1 is a perspective view illustrating a housing constructed in accordance with the present invention with parts broken away.

Referring to FIG. 1 of the drawing, there is a housing which can be constructed of any suitable material such as steel which includes a bottom member having a base 10 with sides 12 projecting upwardly therefrom. A conductor hole 13 is provided in one of the sides 12 of the base 10. A cover 14 is provided for extending over the bottom member and includes a top 16 with side walls 18 extending downwardly therefrom overlapping the sides 12 of the bottom member and terminating adjacent the base 10. A slot 19 is provided in one of the side walls 18 and is in alignment with the hole 13 of base 10. The communication between slot 19 and hole 13 allows a conductor to pass into the interior of the housing. An open top recess housing 20 extends downwardly from the top 16 of the cover with the open top being substantialy flush with the top of the cover. The recess housing 20 has a base 22 with a hole 24 provided therein. The housing 20 is connected to the top 16 by means of welds 21.

Figure 2:
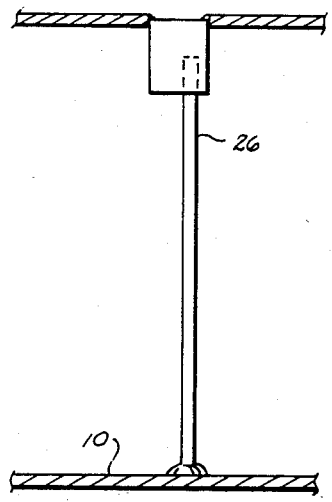
FIG. 2 is a sectional view taken along line 2—2 of FIG. 1.
Figure 3:
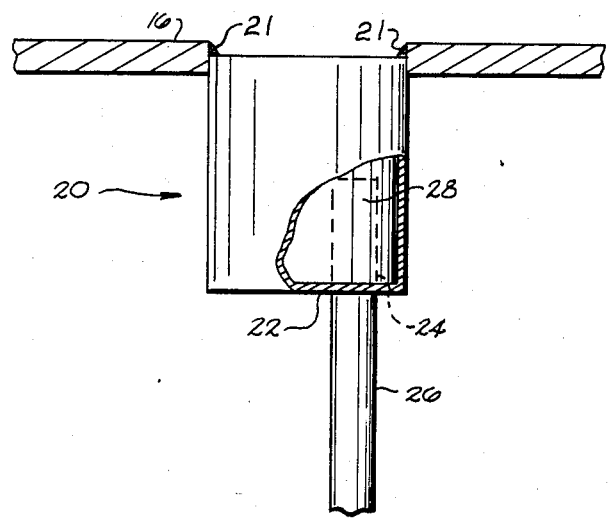
FIG. 3 is a sectional view taken along line 3—3 of FIG. 1.

A locking rod 26 such as shown in FIG. 2 is welded by its lower end to the base 10 of the bottom member. The locking rod extends upwardly and terminates within the open top recess housing 20 when the cover 14 is positioned over the bottom member.

A lock 28 is utilized for securing the cover to the bottom member may be any suitable conventional lock. In the embodiment illustrated, the lock 28 is substantialy oval-shaped and has an opening provided in the bottom thereof for receiving the upper portion of the locking rod 26. Upon rotating a key within the lock 28, the lock can be secured to the top of the locking rod 26. Since the base of the lock is resting on top of the base 22 of the recess housing, such securely holds the cover onto the bottom member.

While a preferred embodiment of the invention has been described using specific terms, such description is for illustrative purposes only, and it is to be understood that changes and variations may be made without departing from the spirit or scope of the following claims.

What is claimed is:

1. A housing for securing equipment therein connected by the means of an electrical conductor to the exterior thereof comprising:
   a bottom member having a base with sides extending upwardly therefrom;
   a cover corresponding in size with said bottom including a top and side walls extending downwardly therefrom overlapping said sides of said bottom member and terminating adjacent said base producing a housing having double side walls;
   an opened top recessed housing extending downwardly from said top of said cover with said opened top being flush with said top of said cover;
   a locking rod having a lower end secured to said base of said bottom member and an upper end terminating in said recessed housing;
   a key-operated lock carried in said cover having an opening provided therein for receiving said upper end of said locking rod for locking said cover onto said bottom member while maintaining the entire lock below the top of said cover only exposing a key receiving face of said lock.

2. The housing as set forth in claim 1 further comprising:
   a hole provided in one of said sides of said bottom member, and
   a slot provided in one side wall of said cover in alignment with said hole.

* * * * *